United States Patent
Chang et al.

(10) Patent No.: US 11,467,207 B2
(45) Date of Patent: Oct. 11, 2022

(54) MASSIVE TESTING OF MICRO INTEGRATED CIRCUIT

(71) Applicant: INDUSTRIAL TECHNOLOGY RESEARCH INSTITUTE, Hsinchu (TW)

(72) Inventors: Yuan-Tai Chang, New Taipei (TW); Li-Chun Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 152 days.

(21) Appl. No.: 17/132,471

(22) Filed: Dec. 23, 2020

(65) Prior Publication Data

US 2022/0196729 A1    Jun. 23, 2022

(51) Int. Cl.
*G01R 31/28* (2006.01)

(52) U.S. Cl.
CPC ..... *G01R 31/2884* (2013.01); *G01R 31/2886* (2013.01)

(58) Field of Classification Search
CPC ............ G01R 31/2884; G01R 31/2886; G01R 31/3004; G01R 31/31922; G01R 31/924; G11C 29/56
See application file for complete search history.

(56) References Cited

U.S. PATENT DOCUMENTS

| | | | |
|---|---|---|---|
| 8,125,235 B2 | 2/2012 | Hung | |
| 8,476,918 B2 | 7/2013 | Huang | |
| 8,847,615 B2 | 9/2014 | Lin et al. | |
| 8,890,557 B2 | 11/2014 | Amoah et al. | |
| 9,349,662 B2 | 5/2016 | Wu et al. | |
| 9,448,285 B2 | 9/2016 | Wang et al. | |
| 9,646,900 B2 | 5/2017 | Ouyang et al. | |
| 9,823,300 B2 | 11/2017 | Pagani et al. | |
| 9,874,586 B2 | 1/2018 | Pagani | |
| 9,995,770 B2 | 6/2018 | Lo et al. | |

(Continued)

FOREIGN PATENT DOCUMENTS

| | | |
|---|---|---|
| TW | 200724950 A | 7/2007 |
| TW | 200827739 A | 7/2008 |

(Continued)

OTHER PUBLICATIONS

TW Office Action in Application No. 110100052 dated Nov. 1, 2021.

*Primary Examiner* — Jermele M Hollington
*Assistant Examiner* — Suresh K Rajaputra
(74) *Attorney, Agent, or Firm* — Maschoff Brennan

(57) ABSTRACT

A massive testing system of a micro integrated circuit includes: a first test area including a plurality of test pads and a plurality of reading pads, and disposed on scribe lines; a plurality of test controllers disposed on the scribe lines one by one; and a probe configured to contact the first test area to test a plurality of rows of integrated circuit chips; wherein each of the plurality of test controllers is configured to test a respective one of the plurality of rows of integrated circuit chips row by row; wherein the probe merely contacts the first test area once; wherein the plurality of reading pads are configured to read test results of each of the plurality of rows of integrated circuit chips row by row.

19 Claims, 8 Drawing Sheets

(56) References Cited

U.S. PATENT DOCUMENTS

| | | |
|---|---|---|
| 10,161,997 B2 | 12/2018 | Ritter |
| 10,180,456 B2 | 1/2019 | Pagani |
| 10,295,588 B2 | 5/2019 | Delacruz et al. |
| 10,495,691 B2 | 12/2019 | Sun et al. |
| 10,598,480 B2 | 3/2020 | Penjovic et al. |
| 2004/0004216 A1 | 1/2004 | Eldridge et al. |
| 2005/0154550 A1 | 7/2005 | Singh et al. |
| 2005/0156165 A1 | 7/2005 | Eldridge et al. |
| 2005/0289428 A1 | 12/2005 | Ong |
| 2011/0267087 A1 | 11/2011 | Huang |
| 2013/0326294 A1 | 12/2013 | Lo et al. |
| 2014/0361804 A1 | 12/2014 | Wang et al. |
| 2017/0023644 A1 | 1/2017 | Huang et al. |
| 2017/0074922 A1* | 3/2017 | Lai .................... G01R 31/2853 |
| 2017/0168132 A1 | 6/2017 | Wagner et al. |
| 2018/0180665 A1* | 6/2018 | Delacruz ............ G01R 31/2894 |
| 2018/0328977 A1 | 11/2018 | Briggs et al. |
| 2020/0371157 A1 | 11/2020 | Choi et al. |

FOREIGN PATENT DOCUMENTS

| | | |
|---|---|---|
| TW | 201348722 A | 12/2013 |
| TW | 201833569 A | 9/2018 |
| TW | 202011039 A | 3/2020 |
| TW | 202013546 A | 4/2020 |

\* cited by examiner

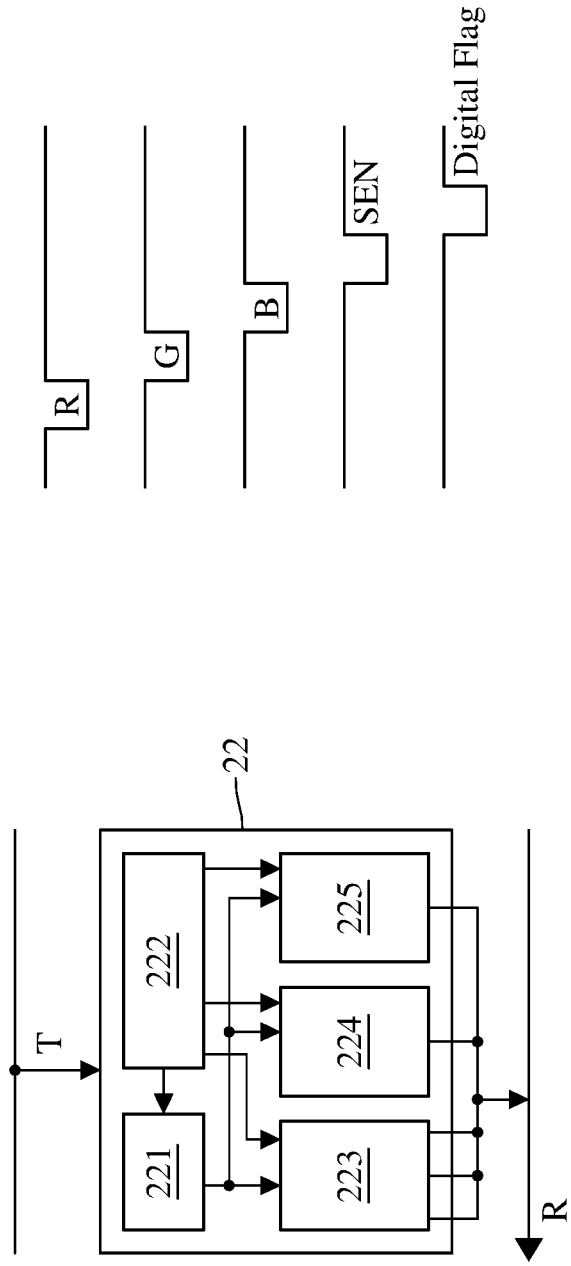
FIG. 4A
FIG. 4B
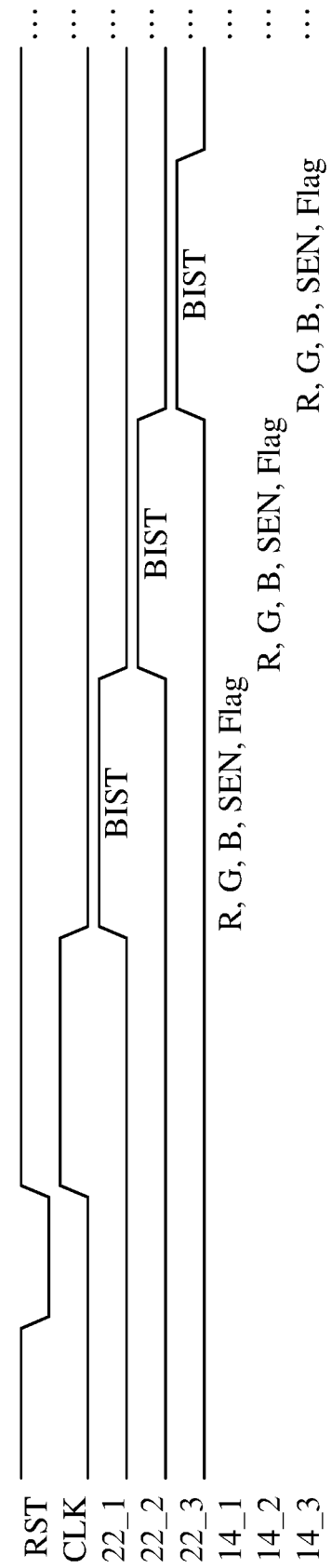
FIG. 4C

MASSIVE TESTING OF MICRO INTEGRATED CIRCUIT

TECHNICAL FIELD

This disclosure relates to a massive testing system and method.

BACKGROUND

Nowadays, the fine-pitch test technology is mainly implemented by probing with a probe card, and the test pitch limit is about 30-50 μm. For a micro integrated circuit (micro-IC), the pitch of test pads on the micro-IC has been miniaturized to less than 13 μm, so it can only be tested by probing with a micro-electrical-mechanical probe card (membrane probe card) rather than the conventional probe card. However, the manufacturing cost of the micro-electrical-mechanical probe card is high.

On the other hand, as the conventional probe card is used to test ICs on a wafer, each IC should be contacted once. The index time of the conventional probe card is 1 second. Using a 8-inch wafer as an example, wherein there are about 44 frames on the 8-inch wafer and there are about 10,000 ICs in each frame, the time to test the wafer must exceed 100 hours since each IC should be contacted once. Therefore, the conventional probe card cannot meet the current demand for high-efficiency testing.

SUMMARY

According to an embodiment of this disclosure, a massive testing system of a micro integrated circuit is applied for testing a plurality of integrated circuit chips in a plurality of frames on a substrate. The system includes: a first test area including a plurality of test pads and a plurality of reading pads, and disposed on scribe lines; a plurality of test controllers disposed on the scribe lines one by one; and a probe configured to contact the first test area to test a plurality of rows of integrated circuit chips; wherein each of the plurality of test controllers is configured to test a respective one of the plurality of rows of integrated circuit chips row by row; wherein the probe merely contacts the first test area once; wherein the plurality of reading pads are configured to read test results of each of the plurality of rows of integrated circuit chips row by row.

According to an embodiment of this disclosure, a massive testing method of a micro integrated circuit is applied for testing a plurality of integrated circuit chips in a plurality of frames on a substrate. The method includes the following steps: forming a first test area on scribe lines wherein the first test area including a plurality of test pads and a plurality of reading pads; forming a plurality of test controllers on the scribe lines; using a probe to contact the first test area to test a plurality of rows of integrated circuit chips; by each of the plurality of test controllers, testing a respective one of the plurality of rows of integrated circuit chips row by row; and by the plurality of reading pads, reading test results of each of the plurality of rows of integrated circuit chips row by row; wherein the probe merely contacts the first test area once.

BRIEF DESCRIPTION OF THE DRAWINGS

The present disclosure will become more fully understood from the detailed description given herein below and the accompanying drawings which are given by way of illustration only and thus are not limitative of the present disclosure and wherein:

FIG. 4A is a schematic diagram of a built-in self-test structure of a micro integrated circuit chip according to an embodiment of this disclosure;

FIG. 4B is a schematic diagram of an activation control of built-in self-test according to an embodiment of this disclosure;

FIG. 4C is a schematic diagram of a control timing sequence of built-in self-test according to an embodiment of this disclosure;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
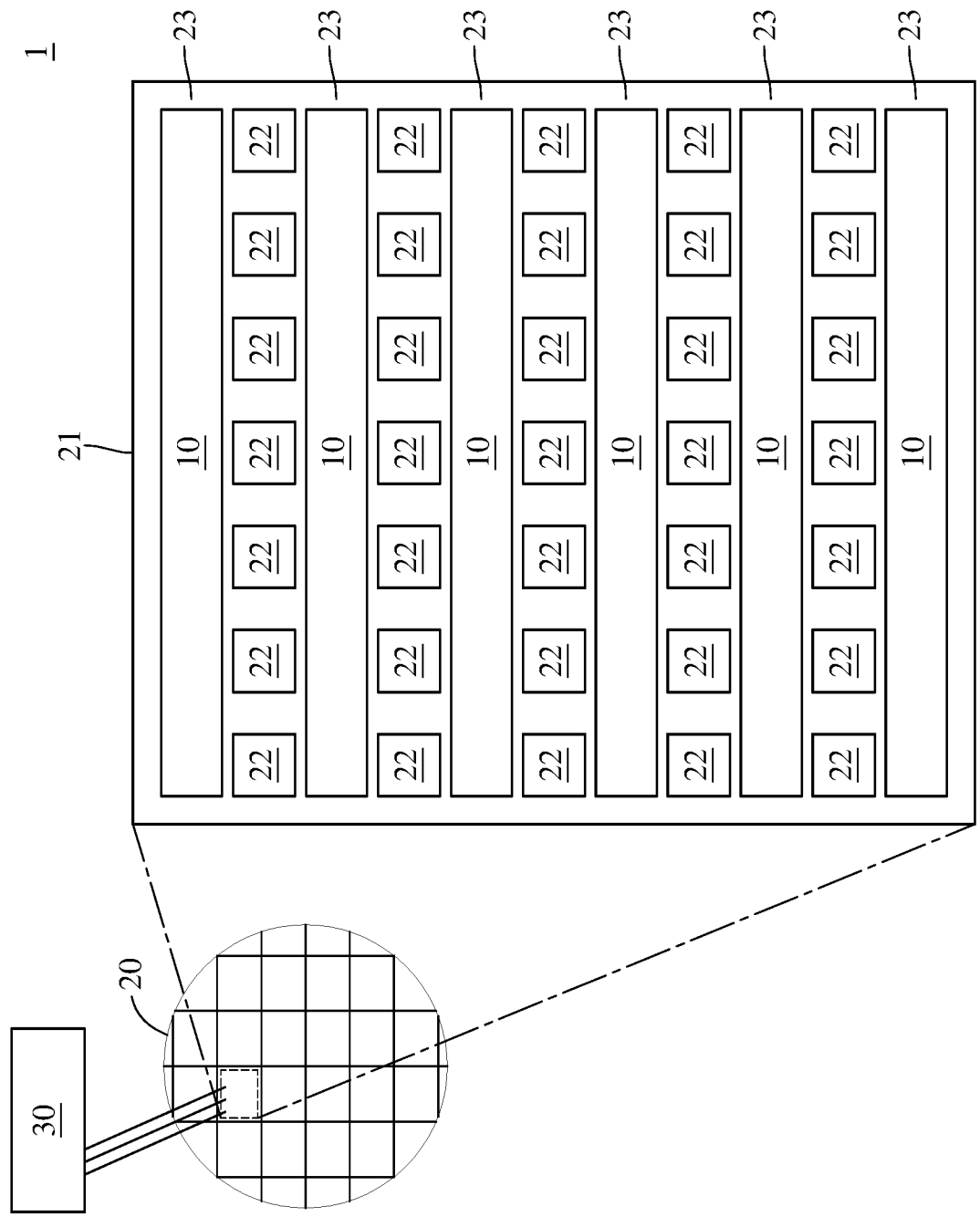
FIGS. 1A-1B are configuration diagrams of a massive testing system of a micro integrated circuit according to an embodiment of this disclosure.
Figure 1B:
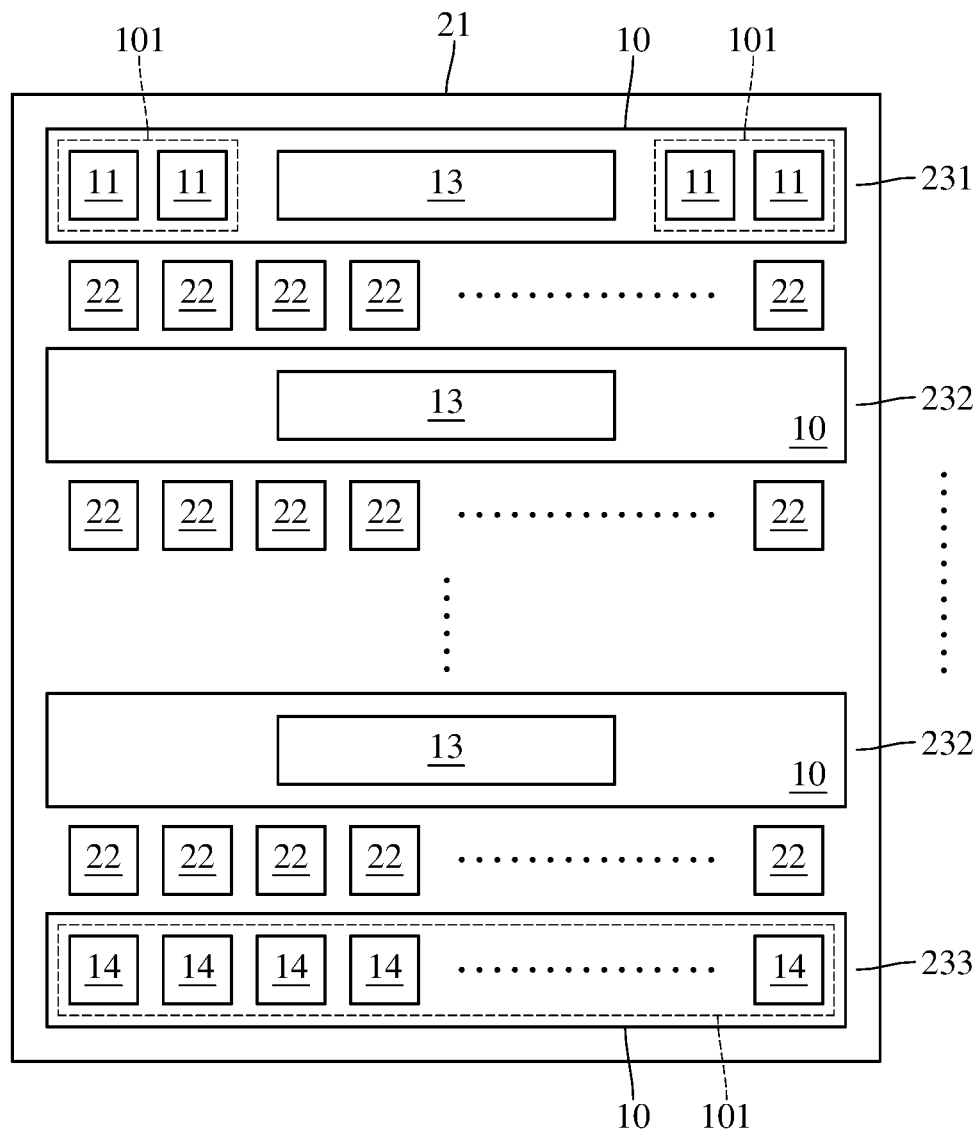

Please refer to FIGS. 1A-1B, which illustrate configuration diagrams of a massive testing system of a micro integrated circuit in an embodiment of this disclosure. As shown in FIG. 1A, the massive testing system 1 includes a integrated circuit chip testing system 10 applied for testing a plurality of integrated circuit chips 22 in a plurality of frames 21 on a substrate 20. In an embodiment, the substrate 20 is a wafer, the integrated circuit chips 22 are micro integrated circuit chips (Micro IC). Each frame 21 includes rows of integrated circuit chips and a plurality of integrated circuit chip testing systems 10, wherein the integrated circuit chip testing systems 10 are disposed on scribe lines 23 one by one. A probe 30 is configured to test the massive testing system 1.

Please refer to FIG. 1B. The scribe lines 23 includes N scribe lines, particularly including the first scribe line 231, a plurality of the second scribe lines 232 and the third scribe line 233. The integrated circuit chip testing system 10 includes the first test area 101, wherein the first test area 101 includes a plurality of test pads 11 and a plurality of reading pads 14, disposed on the scribe lines 23. The reading pads 14 are disposed on the third scribe line 243. In this embodiment, the test pads 11 are disposed on the first scribe line 231, the reading pads 14 are disposed on the third scribe line 243, and the test controllers 13 are disposed on the first scribe line 231 and the second scribe lines 232 one by one.

Figure 1C:
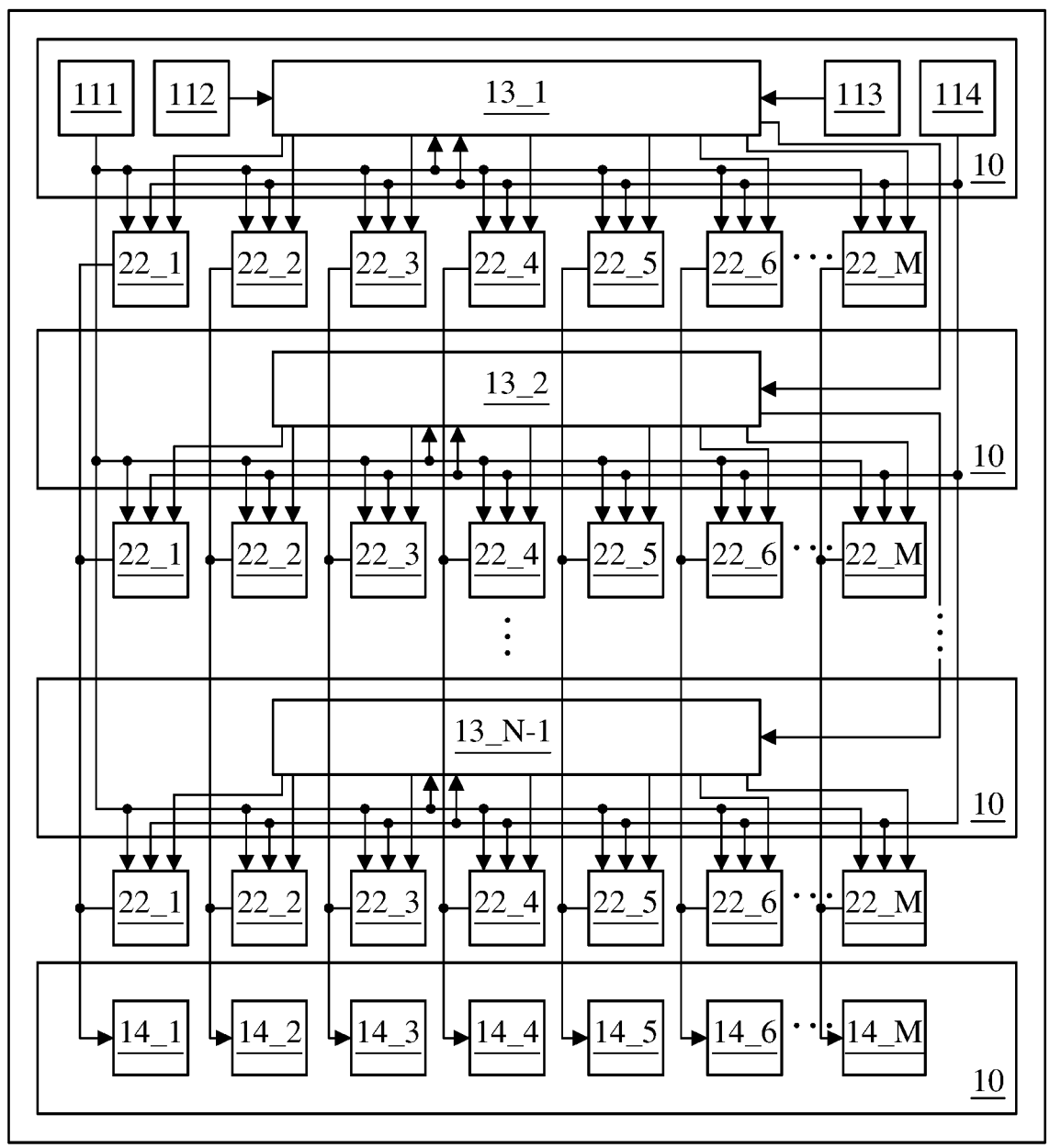
FIG. 1C is a circuit configuration diagram of a massive testing system of a micro integrated circuit according to another embodiment of this disclosure.

Please refer to FIG. 1C, which illustrates a circuit configuration diagram of a massive testing system of a micro integrated circuit in another embodiment of this disclosure. In an embodiment, each row of integrated circuit chips has M integrated circuit chips 22, including the first integrated circuit chip 22_1, the second integrated circuit chip 22_2, ... and the $M^{th}$ integrated circuit chip 22_M. The test controllers 13 includes the first test controller 13_1 in the first row, the second test controller 13_2 in the second row, ... and the $(N-1)^{th}$ test controller 13_N-1 in the $(N-1)^{th}$ row. The test pads 11 includes a power pad 111, a signal pad 112, a digital pad 113 and a ground pad 114, wherein the power pad 111 is electrically coupled to each integrated circuit chip 22_1~22_M in the rows of integrated circuit chips, the signal pad 112 and the digital pad 113 are electrically coupled to the first test controller 13_1 in the first row, and the ground pad 114 is electrically coupled to each integrated circuit chip 22_1~22_M in the rows of integrated circuit chips. The test controllers 13 are electrically coupled to the rows of integrated circuit chips respectively. During the testing of each frame, each of the test controllers 13 is configured to test a respective one of the rows of integrated circuit chips row by row, wherein the first test controller 13_1 tests the first row of integrated circuit chips, the second test controller 13_2 tests the second row of integrated circuit chips, ... and the $(N—1)^{th}$ test controller 13_N-1 tests the $(N-1)^{th}$ row of integrated circuit chips.

Please refer to FIG. 1C. In an embodiment, each of the reading pads 14 is coupled to a respective one of integrated circuit chips in each of the rows of integrated circuit chips, and the reading pads 14 includes the first reading pad 14_1, the second reading pad 14_2, ... and the $M^{th}$ reading pads 14_M, wherein the first reading pad 14_1 is coupled to the first integrated circuit chip 22_1 in each row, the second reading pad 14_2 is coupled to the second integrated circuit chip 22_2 in each row, ..., and the $M^{th}$ reading pad 14_M is coupled to the $M^{th}$ integrated circuit chip 22_M in each row. The reading pads 14 are configured to read the test results of each of the rows of integrated circuit chips row by row.

Figure 2A:
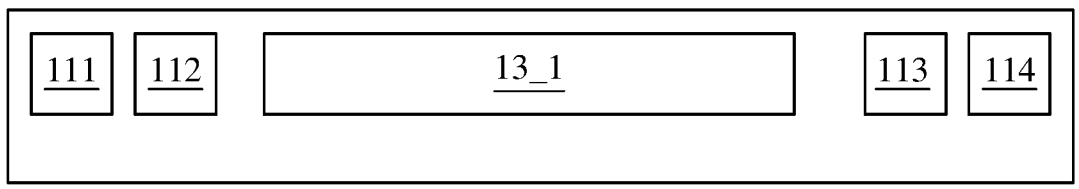
FIGS. 2A-2B are configuration diagrams of test pads in the first area according to embodiments of this disclosure.
Figure 2B:
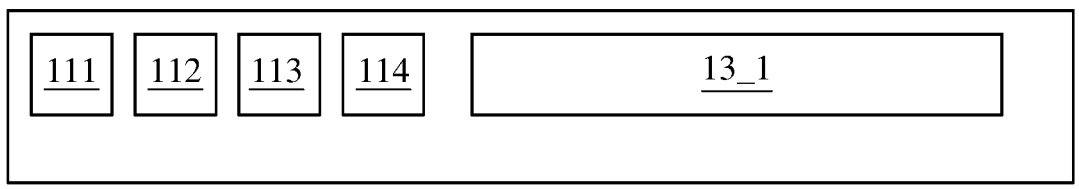

Please refer to FIGS. 2A-2B, which each illustrate a configuration diagram of test pads in the first test area according to an embodiment of this disclosure. In an embodiment, as shown in FIG. 2A, the power pad 111, the signal pad 112, the digital pad 113 and the ground pad 114 are divided into two groups to be disposed on both sides of the first test controller 13_1. In another embodiment, as shown in FIG. 2B, the power pad 111, the signal pad 112, the digital pad 113 and the ground pad 114 are disposed on the same side of the first test controller 13_1.

In the testing of each frame, the probe 30 contacts the first test area 101 once. The probe 30 is configured to contact the power pad 111, the signal pad 112, the digital pad 113, the ground pad 114 and the reading pads 14 at the same time. After the massive testing system 1 tests each of the rows of integrated circuit chips row by row, the reading pads 14 are configured to read the test results of each of the rows of integrated circuit chips row by row. After the probe 30 contacts the first test area 101 once, the massive testing system 1 can complete a row-by-row testing of the rows of integrated circuit chips.

Figure 3A:
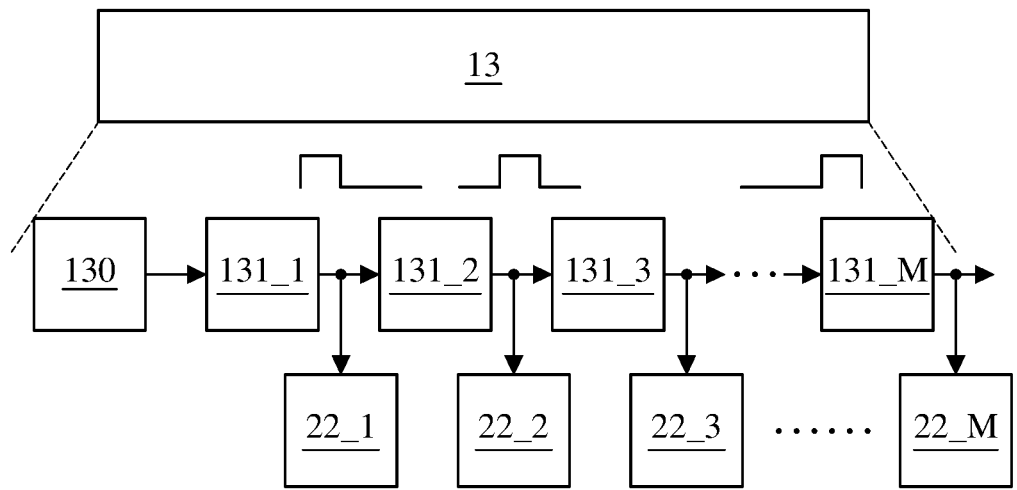
FIGS. 3A-3B are schematic diagrams of a control structure of testing of test controllers according to embodiments of this disclosure.
Figure 3B:
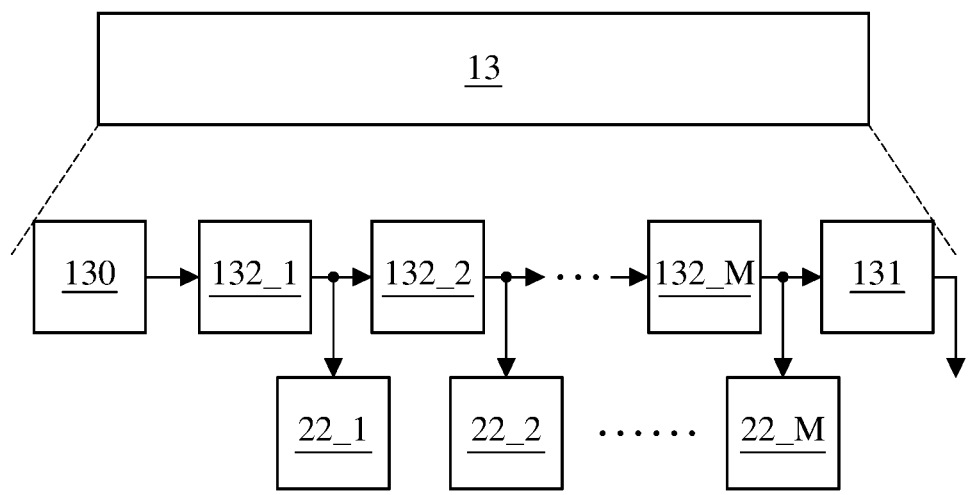

Please refer to FIGS. 3A-3B, which each illustrate a control structure of testing of test controllers in an embodiment of this disclosure. The control structure of the testing of the test controllers can be configured to implement stage-by-stage activation of the integrated circuit chips in the form of an assembly line.

In an embodiment, as shown in FIG. 3A, each of the test controllers 13 is configured to sequentially test each integrated circuit chip 22 in the respective one of the rows of integrated circuit chips. Each of the test controllers 13 includes a logic controller 130 and a plurality of shift registers 131, wherein the logic controller 130 is coupled to the shift registers 131, and each of the shift registers 131 is coupled to the corresponding integrated circuit chip.

The test controller 13 in each row includes a logic controller 130 and M shift registers 131, the M shift registers 131 are serially connected, and each of the shift registers 131 is coupled to the corresponding integrated circuit chip. In this embodiment (please also refer to FIG. 1C), the first shift register 131_1 in the first test controller 13_1 is coupled to the first integrated circuit chip 22_1 in the first row of integrated circuit chips, the second shift register 131_2 in the first test controller 13_1 is coupled to the second integrated circuit chip 22_2 in the first row of integrated circuit chips, ..., the $M^{th}$ shift register 131_M in the first test controller 13_1 is coupled to the $M^{th}$ integrated circuit chip 22_M in the first row of integrated circuit chips, ..., the first shift register 131_1 in the $(N-1)^{th}$ test controller 13_N-1 is coupled to the first integrated circuit chip 22_1 in the $(N-1)^{th}$ row of integrated circuit chips, ..., and the $M^{th}$ shift register 131_M in the $(N-1)^{th}$ test controller 13_N-1 is coupled to the $M^{th}$ integrated circuit chip 22_M in the $(N-1)^{th}$ row of integrated circuit chips. The test controller in each row is coupled to the test controller in the next row. In this embodiment, the first test controller 13_1 is coupled to the second test controller 13_2, the second test controller 13_2 is coupled to the third test controller 13_3, ..., and the $(N-2)^{th}$ test controller 13_N-2 is coupled to the $(N-1)^{th}$ test controller 13_N-1.

After the first test controller 13_1 receives a test signal, the logic controller 130 sequentially activates the shift registers 131 to test the first row of integrated circuit chips 22_1-22_M. The logic controller 130 activates the first shift register 131_1 to transmit the test signal to the integrated circuit chip 22_1, and the first reading pad 14_1 reads the test result of the integrated circuit chip 22_1; then, the logic controller 130 activates the second shift register 131_2 to transmit the test signal to the integrated circuit chip 22_2, and the second reading pad 14_2 reads the test result of the integrated circuit chip 22_2; ... ; the logic controller 130 activates the $M^{th}$ shift register 131_M to transmit the test signal to the integrated circuit chip 22_M, and the $M^{th}$ reading pad 14_M reads the test result of the integrated circuit chip 22_M; after the first test controller 13_1 completes the testing of the first row of integrated circuit chips 22_1-22_M, the first test controller 13_1 transmits the test signal to the second test controller 13_2, the logic controller 130 in the second row sequentially activates the shift registers 131 to test the second row of integrated circuit chips 22_1-22_M, and the reading pads 14 sequentially read the test results of the integrated circuit chips 22_1-22_M in the second row; ... ; the logic controller 130 in the $(N-1)^{th}$ row sequentially activates the shift registers 131 to test the $(N-1)^{th}$ row of integrated circuit chips 22_1-22_M, and the reading pads 14 sequentially read the test results of the integrated circuit chips 22_1-22_M in the $(N-1)^{th}$ row; the testing of the first frame is completed.

In another embodiment, as shown in FIG. 3B, each of the test controllers 13 tests each integrated circuit chip 22 in the respective one of the rows of integrated circuit chips at the same time. Each of the test controllers 13 includes a logic controller 130, a plurality of drivers 132 and a shift register 131, wherein the logic controller 130 is coupled to the driver 132 and the shift register 131, each of the drivers 132 is coupled to the corresponding integrated circuit chip 22, and the shift register 131 in each row is coupled to the test controller in the next row. In this embodiment (please also refer to FIG. 1C), the test controller 13 in each row includes a logic controller 130, M drivers 132 and a shift register 131, wherein the M drivers 132 are serially connected, the logic controller 130 is coupled to the first driver 132, the $M^{th}$ driver 132 is coupled to the shift register 131, and that is, each driver 132 is coupled to the corresponding integrated circuit chip 22. In this embodiment, the first driver 132_1 in the first test controller 13_1 is coupled to the first integrated circuit chip 22_1 in the first row of integrated circuit chips, the second driver 132_2 is coupled to the second integrated circuit chip 22_2 in the first row of integrated circuit chips, . . . , the $M^{th}$ driver 132_M is coupled to the $M^{th}$ integrated circuit chip 22_M in the first row of integrated circuit chips, . . . , the first driver 132_1 in the $(N-1)^{th}$ test controller 13_N-1 is coupled in the first integrated circuit chip 22_1 in the (N-1) row of integrated circuit chips, . . . , the $M^{th}$ driver 132_M in the $(N-1)^{th}$ test controller 13_ N-1 is coupled to the $M^{th}$ integrated circuit chip 22_M in the $(N-1)^{th}$ row of integrated circuit chips. The shift register 131 of the test controller 13 in each row is coupled to the test controller in the next row. For example, the shift register 131 of the first test controller 13_1 is coupled to the second test controller 13_2, . . . , and the shift register 131 of the $(N-2)^{th}$ test controller is coupled to the shift register 131 of the $(N-1)^{th}$ test controller 13_N-1.

After the first test controller 13_1 receives a test signal, the logic controller 130 activates the shift registers 131 at the same time to test the first row of integrated circuit chips 22_1-22_M. The logic controller 130 activates the drivers 132_1-132_M at the same time to transmit the test signal to the integrated circuit chips 22_1-22_M, and the reading pads 14_1-14_M read the test results of the integrated circuit chips 22_1-22_M; after the first test controller 13_1 completes the testing of the first row of integrated circuit chips 22_1-22_M, the shift register 131 in the first row transmits the test signal to the second test controller 13_2, the logic controller 139 in the second row activates the drivers 132_1-132_M at the same time to transmit the test signal to the integrated circuit chips 22_-22_M, and the reading pads 14 reads the test results of the integrated circuit chips 22_1-22_M; . . . ; the logic contoller 130 in the $(N-1)^{th}$ row activates the drivers 132_1-132_M at the same time to transmit the test signal to the integrated circuit chips 22_1-22_M, and the reading pads 14 read the test results of the integrated circuit chips 22_1-22_M; the testing of the first frame is completed.

In some embodiments, each of the integrated circuit chips futher includes a built-in self-test (BIST) structure. Please FIGS. 4A-4C, wherein FIG. 4A illustrates the BIST structure of an integrated circuit chip in an embodiment of this disclosure, FIG. 4B illustrates the activation control of the BIST in an embodiment of this disclosure, and FIG. 4C illustrates the control timing sequence of the BIST in an embodiment of this disclosure. The BIST structure is disposed in each of the integrated circuit chips. When testing the integrated circuit chips, the test controller activates the BIST in each micro integrated circuit chip. In an embodiment, as shown in FIG. 4A, when the test controller inputs a test signal (T) to the power supply 221 through the shift register 131, the BIST module 222 is activated to test the driver 223, the sensor 224 and the digital circuit 225 in the micro integrated circuit chip in order and output the test results (R), and the reading pads reads the test results (R). Please refer to FIG. 4B. The activation order of the BIST is driver 223 (signals labeled as "R", "G", "B"), sensor 224 (signal labeled as "SEN") and digital circuit 225 (signal labeled as "Digital Flag"). Please refer to FIG. 4C and also refer to FIG. 3A, wherein FIG. 4C shows the control timing sequence for activating the BIST of the integrated circuit chips 22 in the embodiment of FIG. 3A. The BIST of the integrated circuit chip 22_1 is activated, the other integrated circuit chips 22 in the same row are disabled, and the first reading pad 14_1 reads the test result according to the activation order of BIST in FIG. 4B; then, the BIST of the integrated circuit chip 22_2 is activated, the other integrated circuit chips 22 in the same row are disabled, and the second reading pad 14_2 reads the test result according to the activation order of BIST in FIG. 4B . . . ; the integrated circuit chips 22 in the same row can be tested in order.

Figure 5A:
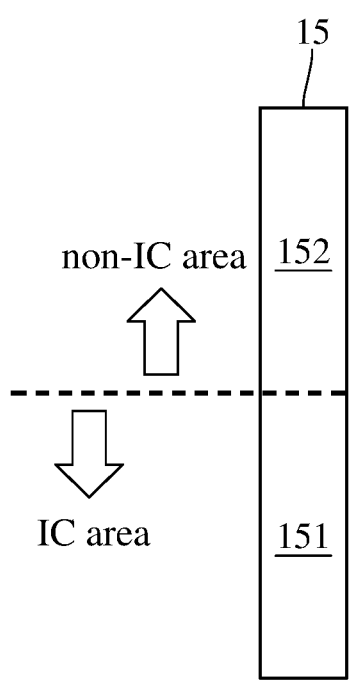
FIGS. 5A-5B are schematic diagrams of a connecting wire according to embodiments of this disclosure.
Figure 5B:
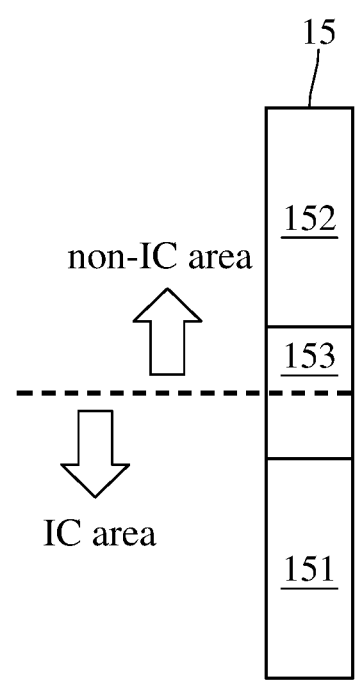

Please refer to FIGS. 5A-5B, which each illustrate a schematic diagram of a connecting wire according to an embodiment of this disclosure. The material of the connecting wire between the each of the test controllers and each of the rows of integrated circuit chips is elected from the group consisting of metal, polycrystalline and indium tin oxide. In an embodiment, as shown in FIG. 5A, the connecting wire 15 can be divided into the first segment 151 that connects the integrated circuit chip area (IC area) and the second segment 152 that connects the non-integrated circuit chip area (non-IC area) such as the test control area, wherein the material of the first segment 151 and the second segment 152 is selected from one of metal, polycrystalline and indium tin oxide. In another embodiment, as shown in FIG. 5B, the connecting wire 15 can be divided into the first segment that connects the integrated circuit chip area (IC area), the second segment 152 that connects the non-integrated circuit chip area (non-IC area) such as the test control area, and the third segment 153 between the first segment 151 and the second segment 152, wherein the material of the first segment 151 and the second segment 152 is selected from metal, and the material of the third segment 153 is selected from one of polycrystalline and indium tin oxide.

Figure 6A:
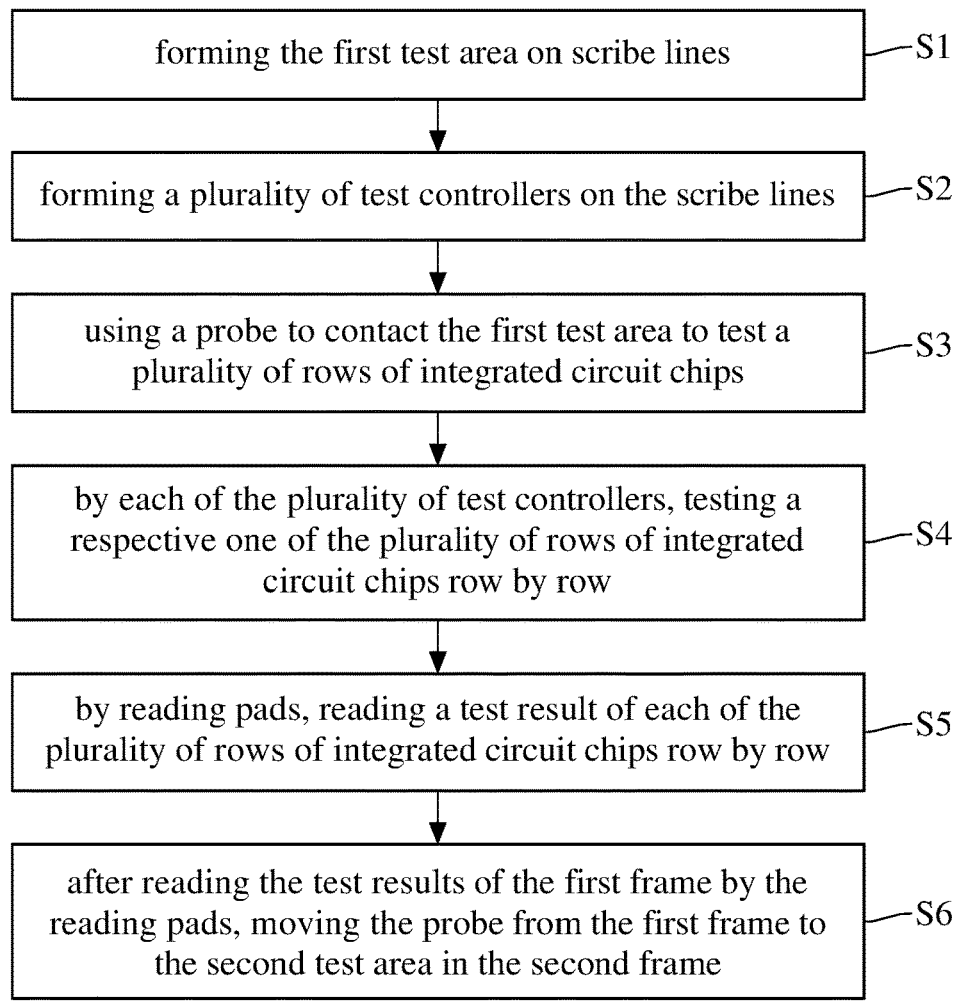
FIGS. 6A-6B are flow charts of a massive testing method of a micro integrated circuit according to an embodiment of this disclosure.
Figure 6B:
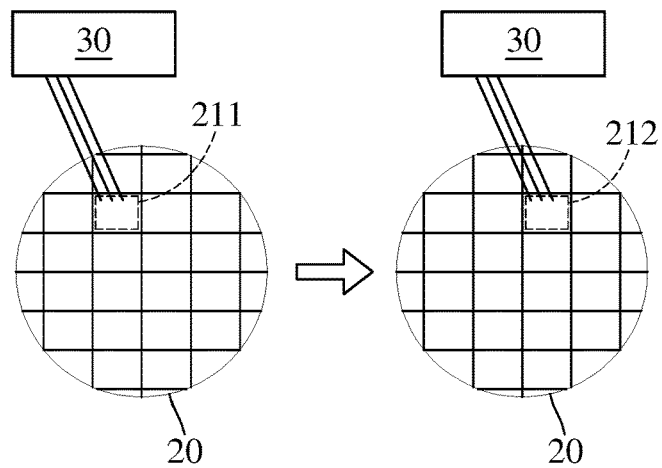

Please refer to FIGS. 6A-6B, which illustrate flow charts of a massive testing method of a micro integrated circuit in an embodiment of this disclosure. As shown in FIG. 6A, the massive testing method includes step S1, forming the first test area 101 on scribe lines 23, wherein in an embodiment, the first test area 101 is formed on the first scribe line 231 and the third scribe line 233, and the first test area 101 includes the test pads 11 formed on the first scribe line 231 and a plurality of reading pads 14 formed on the third scribe line 233; step S2, forming a plurality of test controllers 13 on the scribe lines 23, wherein in an embodiment, the test controllers 13 are formed on the first scribe line 231 and the second scribe lines 232; step S3, using a probe 30 to contact the first test area 101 to test a plurality of rows of integrated circuit chips; step S4, by each of the plurality of test controllers 13, testing a respective one of the plurality of rows of integrated circuit chips row by row, wherein the probe 30 merely contacts the first test area 101 once; step S5, by reading pads 14, reading a test result of each of the plurality of rows of integrated circuit chips row by row; and step S6 (please also refer to FIG. 6B), after reading the test results of the first frame 211 by the reading pads 14, moving the probe 30 from the first frame 211 to the second test area 102 in the second frame 212, wherein the probe 30 contacts the second test area 12 to test a plurality of integrated circuit chips 22 in the second frame 212, and the probe 30 merely contacts the second test area 102 once.

Please refer to step S3. In this step, the probe 30 is used to test the rows of integrated circuit chips while contacting the power pad 111, the signal pad 113, the digital pad 113, the ground pad 114 and the reading pads 14; after the probe 30 contacts the first test area 101, each of the test controllers 13 activates the internal circuit to be tested of each integrated circuit chip 22 by built-in self-test.

Please refer to step S5. In this step, the reading pads 14 are coupled to each of the rows of integrated circuit chips, and each of the reading pads 14 is coupled to a respective one of integrated circuit chips 22 in each of the rows of integrated circuit chips.

In view of the above, massive testing system and method of a micro integrated circuit (micro-IC) is provided in this disclosure. By setting up test pads and integrated circuit testing system on scribe lines of a wafer, the cost of testing equipment may be reduced, and by massive testing method, the probe may test all integrated circuit chips in each frame row by row by merely contacting the test area in each frame once, instead of contacting all the integrated circuit chips in each frame. Therefore, the time to test all the integrated circuit chips in each frame may be greatly reduced, thereby improving the efficiency of wafer testing.

What is claimed is:

1. A massive testing system of a micro integrated circuit, applied for testing a plurality of integrated circuit chips in a plurality of frames on a substrate, and including:
    a first test area including a plurality of test pads and a plurality of reading pads, and disposed on scribe lines;
    a plurality of test controllers disposed on the scribe lines one by one; and
    a probe configured to contact the first test area to test a plurality of rows of integrated circuit chips;
    wherein each of the plurality of test controllers is configured to test a respective one of the plurality of rows of integrated circuit chips row by row;
    wherein the probe merely contacts the first test area once;
    wherein the plurality of reading pads are configured to read test results of each of the plurality of rows of integrated circuit chips row by row.

2. The massive testing system of the micro integrated circuit according to claim 1, wherein the plurality of test pads includes a power pad, a signal pad, a digital pad and a ground pad.

3. The massive testing system of the micro integrated circuit according to claim 1, wherein the plurality of reading pads are coupled to each of the plurality of rows of integrated circuit chips, and each of the plurality of reading pads is coupled to a respective one of integrated circuit chips in each of the plurality of rows of integrated circuit chips.

4. The massive testing system of the micro integrated circuit according to claim 2, wherein the power pad, the signal pad, the digital pad and the ground pad are divided into two groups to be disposed on both sides of a first test controller in the plurality of test controllers.

5. The massive testing system of the micro integrated circuit according to claim 2, wherein the power pad, the signal pad, the digital pad and the ground pad are disposed on the same side of a first test controller in the plurality of test controllers.

6. The massive testing system of the micro integrated circuit according to claim 1, wherein each of the plurality of test controllers tests each integrated circuit chip in the respective one of the plurality of rows of integrated circuit chips at the same time.

7. The massive testing system of the micro integrated circuit according to claim 1, wherein each of the plurality of test controllers is configured to sequentially test each integrated circuit chip in the respective one of the plurality of rows of integrated circuit chips.

8. The massive testing system of the micro integrated circuit according to claim 1, wherein after the plurality of reading pads read test results of a first frame, the probe is configured to move from the first frame to a second test area in a second frame, the probe contacts the second test area for testing a plurality of integrated circuit chips in the second frame; wherein the probe merely contacts the second test area once.

9. The massive testing system of the micro integrated circuit according to claim 1, wherein after the probe contacts the first test area, each of the plurality of test controllers is configured to activate an internal circuit to be tested of each integrated circuit chip by built-in self-test.

10. The massive testing system of the micro integrated circuit according to claim 1, wherein each of the plurality of test controllers includes a logic controller and a plurality of shift registers, wherein the logic controller is coupled to the plurality of shift registers, each of the plurality of shift registers is coupled to a corresponding integrated circuit chip.

11. The massive testing system of the micro integrated circuit according to claim 1, wherein each of the plurality of test controllers includes a logic controller, a plurality of drivers and a shift register, wherein the logic controller is coupled to the plurality of drivers and the shift register, each of the plurality of drivers is coupled to a corresponding integrated circuit chip, and the shift register is coupled to a test controller in a next row.

12. The massive testing system of the micro integrated circuit according to claim 1, wherein a material of a connecting wire between each of the plurality of test controllers and each of the plurality of rows of integrated circuit chips is selected from a group consisting of metal, polycrystalline and indium tin oxide.

13. A massive testing method of a micro integrated circuit, applied for testing a plurality of integrated circuit chips in a plurality of frames on a substrate, and including steps as follows:
    forming a first test area on scribe lines wherein the first test area including a plurality of test pads and a plurality of reading pads;
    forming a plurality of test controllers on the scribe lines;
    using a probe to contact the first test area to test a plurality of rows of integrated circuit chips;
    by each of the plurality of test controllers, testing a respective one of the plurality of rows of integrated circuit chips row by row; and
    by the plurality of reading pads, reading test results of each of the plurality of rows of integrated circuit chips row by row;
    wherein the probe merely contacts the first test area once.

14. The massive testing method of the micro integrated circuit according to claim 13, wherein the plurality of test pads includes a power pad, a signal pad, a digital pad and a ground pad.

15. The massive testing method of the micro integrated circuit according to claim 13, wherein the plurality of reading pads are coupled to each of the plurality of rows of integrated circuit chips, and each of the plurality of reading pads is coupled to a respective one of integrated circuit chips in each of the plurality of rows of integrated circuit chips.

16. The massive testing method of the micro integrated circuit according to claim 13, wherein each of the plurality of test controllers tests each integrated circuit chip in the respective one of the plurality of rows of integrated circuit chips at the same time.

17. The massive testing method of the micro integrated circuit according to claim 13, wherein each of the plurality of test controllers is configured to sequentially test each integrated circuit chip in the respective one of the plurality of rows of integrated circuit chips.

18. The massive testing method of the micro integrated circuit according to claim 13, wherein after the probe contacts the first test area, each of the plurality of test controllers is configured to activate an internal circuit to be tested of each integrated circuit chip by built-in self-test.

19. The massive testing method of the micro integrated circuit according to claim 13, wherein after the plurality of reading pads read test results of a first frame, the probe moves from the first frame to a second test area in a second frame, the probe contacts the second test area for testing a plurality of integrated circuit chips in the second frame; wherein the probe merely contacts the second test area once.

\* \* \* \* \*